United States Patent [19]

Ranky

[11] Patent Number: 5,072,200

[45] Date of Patent: Dec. 10, 1991

[54] COMBINATION OF ACTIVE AND PASSIVE FILTERS

[76] Inventor: Bela Ranky, 47-12 156th St., Flushing, N.Y. 11355

[21] Appl. No.: 608,240

[22] Filed: Nov. 2, 1990

Related U.S. Application Data

[63] Continuation-in-part of Ser. No. 440,699, Nov. 24, 1989, abandoned.

[51] Int. Cl.⁵ .................... H03H 7/01; H03H 11/04
[52] U.S. Cl. .................... 333/167; 333/168; 333/172; 333/175; 328/167; 330/109
[58] Field of Search ............. 333/167, 168, 175, 176; 328/167; 330/107, 109

[56] References Cited

U.S. PATENT DOCUMENTS

| | | | |
|---|---|---|---|
| 3,522,457 | 8/1970 | Perra | 328/167 X |
| 3,849,677 | 11/1974 | Stacey | 333/174 X |
| 3,904,978 | 9/1975 | Daniels et al. | 330/109 |
| 4,560,963 | 12/1985 | Sharpe | 333/167 X |
| 4,594,648 | 10/1986 | Gallios | 328/167 X |
| 4,920,563 | 4/1990 | Lemaire | 333/176 X |

FOREIGN PATENT DOCUMENTS 57511  4/1984  Japan .................. 333/167

OTHER PUBLICATIONS

Cottam, P. J.; *Filters*; Chap. 36; pp. 36/1–36/16.

*Primary Examiner*—Eugene R. LaRoche
*Assistant Examiner*—Benny Lee

[57] ABSTRACT

A combination of passive electrical filters and active electrical filters in a series arrangement forming active passive band pass or high pass or low pass or band reject filters. The preferred embodiment includes an amplifier stage to include high input impedance. These filter combinations are free of internal electrical noise.

5 Claims, 1 Drawing Sheet

COMBINATION OF ACTIVE AND PASSIVE FILTERS

BACKGROUND OF THE INVENTION

This is a continuation-in-part of application Ser. No. 440,699 filed Nov. 24, 1989. now abandoned.

FIELD OF INVENTION

This invention relates generally to electronic filters, particularly a combination of passive and active electronic filters.

PRIOR ART

Passive filters, so-called because they operate without a source of outside power, are known in the art. Generally, these filters comprise capacitors and inductors and make use of the reactive impedance associated with each of these types of components, to attenuate electrical signals of a certain frequency. Passive filters also attenuate, to a lesser degree, signals having frequencies which are not to be filtered, i.e., the frequency band which is to be passed. This causes a loss of energy in the desired signals. Passive filters, even those designed properly to match the source and load impedances of the system, all attenuate the pass band to a certain extent. This loss is called "insertion loss".

Another problem common to passive filters is that they are usually of relatively large size and bulk. This results from the fact that inductors are a major component of passive filters, and inductors are generally relatively large and bulky components, typically including coils and cores of a size dictated by the amount of their inductance. Furthermore, a large amount of inductance is required to attenuate low frequency signals. It therefore stands that passive filters for attenuating low frequency signals may be unduly large.

A further problem known to passive inductive/capacitive filters is that such filters are highly susceptible to outside noise interference. Interference, generally electromagnetic radiation, is picked up by the inductors and thereby introduces into the system. In order to protect the circuit from electromagnetic interference, the filter must be shielded, further contributing to the size and bulk of the filter.

Active filters, on the other hand, require an outside source of power to operate, and generally comprise of operational amplifiers in electrical combination with resistors and capacitors. No inductors are required.

The absence of inductors provides a two-fold benefit to active filters. The first benefit is that active filters are much smaller than passive filters. A second benefit is that the filter is not susceptible to outside electromagnetic interference.

Active filters, comprised of operational amplifiers, are constructed so that the pass-band is not attenuated but is usually amplified. This creates a problem as the filters, being comprised of active semiconductor components, inject their own noise into the filtered signal. This noise is amplified by the filter and passed along to the output.

U.S. Pat. No. 4,383,229 (Jones) discloses a resonant filter clipper circuit. Jones discloses two passive filter sections sandwiching an active filter section and forming a frequency-specific filter intended to remove certain frequency components. The active filter section attenuates frequencies above 16 KHz and is expressly described as a low pass filter (specification, column 2, lines 49-50).

The first passive filter section 10 in Jones has a resonant circuit 14, which resonates at 28 KHz, shunting signals at or near this frequency to ground. A further part of first passive filter section 10 is RL series leg 12 comprised of resistor 38 and inductor 40.

The reactive impedance of inductors increases with the frequency of the applied signal. Higher frequency signals will therefore be blocked by RL series leg 12. Signals at or near the high frequency of 28 KHz will be shunted to ground. Lower frequency signals will pass. Accordingly, first passive filter section 10 is clearly a low pass filter, and primarily is directed to removing frequency components at 28 KHz.

Second passive filter section 24 is identical to first passive filter section 10 except that resonant circuit 28 resonates at 19 KHz. Second passive filter section 24, like first passive filter section 10 also contains series inductor 64 for effectively blocking high frequency signals from output 34. Whether one regards the specific frequencies of 19 KHz or 28 KHz as "high" or "low", second passive filter section 24, like first passive filter section 10 is a low pass filter.

Jones thus discloses a series of low pass filter sections including active and passive low pass filter sections which combine to form a low pass filter. Jones deals with the problems of attenuating high frequencies and does not teach a method by which low frequencies are attenuated as well as high frequencies so that only a relatively small band of frequencies is passed. Jones does not suggest any particular arrangement of active and passive sections that provide band pass capabilities.

Jones teaches the use of an active low pass filter. Active low pass filters are large in size and inject unwanted noise to the signal to be filtered. This noise is due to, for example, power supply ripple, junction noise in semiconductor elements and the like.

U.S. Pat. No. 3,621,412 (Keeling) discloses using a switch to choose between a number of passive components to be included in an active filter network for determining the cutoff frequency of the active network. Keeling provides as stated, at column 1, line 74, a method of providing an active filter system with selectable cutoff frequencies ... . Feedback path 24 between the output of amplifier 22 and the passive components are evidence that the filter, on the whole, is simply a switchable active filter.

U.S. Pat. No. 3,983,504 (Moy) discloses an active filter, as stated in the title. The RC circuit defined in FIG. 1 of Moy, when connected to the inverting input of the operational amplifier as in FIG. 3, defines an active notch filter, not a band-pass filter (column 1, lines 32-35). The circuit in FIG. 1 does not disclose a passive low pass filter. The circuit of FIG. 1 has capacitors not inductors, in series with the signal input. Capacitors block not pass, low frequency signals. U.S. Pat. No. 3,829,626 (Irwin et al) discloses a telephone line equalizer. It does not disclose or suggest passive low pass filters in series with active high pass filters. The purpose of the amplifiers disclosed in the reference is to amplify the signal, not filter it.

There is a need, therefore to provide a filter which minimizes the disadvantages known to active and passive filters, respectively, i.e., filters having only active or only passive sections, in a manner that is practical and effective.

There is also a need to provide a combination active-passive filter that attenuates low as well as high frequency signals so that a relatively small band of frequencies is passed. There is a further need to provide such a filter wherein the low pass section is passive. Passive low pass filters are simple in design, small in size, and most importantly, do not add unwanted noise to the signal.

There is still further need to include a high impedance amplifier to the filter combination to provide a filter having high input impedance. It is also desirable to include inductors having gapped potcores in the passive filter stage to provide the stage with adjustable attenuation characteristics.

The above noted needs are met by the active-passive filter combination of the invention.

SUMMARY OF THE INVENTION

It is a general object of this invention to provide a filter for electrical signals.

It is a further object of the invention to provide a filter for electrical signals which is small in size.

It is a further object of the invention to provide a filter which by design is less subject to electromagnetic interference.

A further object of the invention is to provide a low-noise filter for electrical signals.

Another object of the invention is to provide a filter for electrical signals which does not attenuate the energy of the signal which is to be passed.

Usually the filter permits one section of the electric frequency spectrum to pass. A filter such as this is called a low pass, high pass, band pass, or band reject filter, be it active or passive.

In the accomplishment of the foregoing objects, a series combination active/passive filter is provided. In one embodiment of the device a passive low-pass filter is combined in series with an active high pass filter and an active amplifier to produce a filter having none of the aforementioned drawbacks common to each type of filter when employed alone.

The active amplifier on the input section provides for high input impedance, further reducing the size of the inductors necessary for the low-pass filter.

A passive low-pass filter section is connected in series to the active amplifier section. This low-pass section, as the name suggests, attenuates only relatively higher frequency components while allowing relatively lower frequency components to pass. By judicious choice of capacitive and inductive components, the frequency spectrum of signals to be attenuated is defined. Furthermore, it is preferable to use selectively variable inductors having gapped potcores to vary the section's inductance for varying the stop band without exchanging components.

Since low frequency signals are to be passed, not much inductance is required. This allows for the use of small inductive components and capacitors and hence a small circuit layout. Signal loss is kept to a minimum by the high impedance amplifier on the filter input stage. No noise is generated by this passive filter section.

In order to filter out the desired band of low frequency signals, an active high-pass filter is provided as a subsequent section of the filter. This section, being comprised of small semiconductor components, resistors and capacitors, is much smaller in size than any passive filter which would be used comparably to attenuate low frequency signals.

Active low-pass filters are known to have direct current offset voltage problems. As many of the sections of the filter must be direct current coupled, a direct current voltage may appear on the filter output. A separate filter is therefore necessary to block this direct current voltage. Active high pass filters are alternating current coupled and accordingly do not produce a DC signal at the filter output.

The disclosed series combination of a high impedance amplifier section, a passive low-pass filter section, and an active high-pass filter section provides a band-pass filter without the problems which exist when using an all-active filter or an all-passive filter to attenuate a broad frequency spectrum of electrical signals both above and below the pass-band. By using a passive low pass filter to filter relatively high frequencies from a signal, noise is not introduced into the filtered signal. An active high pass filter section to filter relatively low frequencies maintains compactness of the overall filter size by eliminating the need for large inductors and protective shielding. The use of the amplifier section allows the passive section to be operated at high impedances, further allowing small-sized inductors and capacitors to be chosen for the low-pass section. A filter according to the disclosed design is dimensioned, for example as small as 5 cm $\times$ 4 cm $\times$ 1.5 cm, or smaller. This is six times smaller than a passive filter alone and two times smaller than an active filter alone performing comparable filter functions.

The filter arrangement according to the invention can be advantageously employed in the field of digital communication, where an analog to digital converter is a major element. Analog to digital converters need a so-called anti-aliasing filter. Active low-pass anti-aliasing filters have their own noise which masks any further attenuation. Such a circuit employing the filter according to the invention is practically noiseless.

Digital communication, digital recording up to the video range, and other applications, use analog to digital converters. To get high picture resolution, for example, the signal must be digitized to high resolution (e.g., 14 bits). An anti-aliasing filter for this application requires a stop band attenuation of 90 DB According to the invention stop band attenuation has been measured at 100 DB.

The above listed preferred aspects are not intended as limiting. For instance, according to the invention a plurality of active and passive stages can be incorporated into the design of a filter for providing highly defined attenuation of the desired stop-band. Similarly, the order of the respective filter sections can be varied as necessary. As many amplifier sections as are desired can be included in the filter network.

The invention is disclosed herein with reference to certain preferred embodiments, discussed hereinafter in detail. Additional variations will occur to persons skilled in the art and aware of this disclosure. Accordingly, reference should be made to the appended claims rather than the foregoing specification in assessing the scope of the invention in which exclusive rights are claimed.

DETAILED DESCRIPTION OF THE PREFERRED EMBODIMENTS

Figure 1:
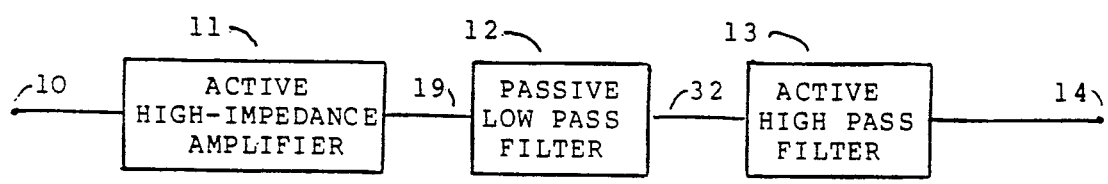
FIG. 1 is a block diagram of a preferred embodiment of the invention showing a series connected active amplifier, passive low pass filter and active high pass filter.
Figure 2:
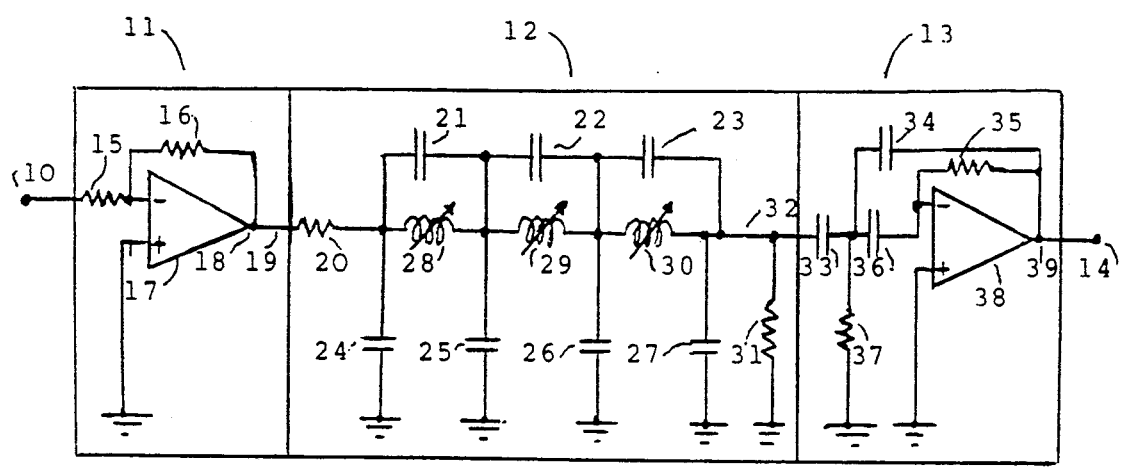
FIG. 2 is a schematic diagram of a preferred embodiment according to FIG. 1.

Referring to FIGS. 1 and 2, the signal to be filtered is coupled to system 9 at input 10. The signal is forwarded to active high impedance amplifier stage 11. As seen in FIG. 2, the high impedance amplifier stage 11 comprises resistors 15 and 16 connected in combination with operational amplifier 17 in the common inverting amplifier configuration as shown. Operational amplifier 17, by choice of appropriate values for resistors 15 and 16, can add some gain to increase the signal level. It may also be desirable in some instances for resistors 15 and 16 to be of such value so that no gain is imparted, the active high-impedance stage 11 providing only high input impedance at the input to system 9.

The output 18 of operational amplifier 17 is coupled to passive low pass filter section 12 at point 19. As seen in FIG. 2, the low pass filter section 12 comprises resistors 20 and 31, capacitors 21 through 27, and variable inductors 28 to 30. Low pass filter section 12 is constructed in the known manner so as to allow signals having relatively lower frequencies to pass unattenuated, while blocking (by means of inductors 28 to 30) or shunting to ground (by means of capacitors 24 to 27) signals having relatively higher frequency components.

By providing variable inductors such as inductors with gapped potcores, the inductance of inductors 28, 29 and 30 can be manually alterable to tune low pass filter sections 12 so that the stop or rejection band of the section is user selectable.

The signal, now devoid of selected higher frequencies, is coupled to high pass filter stage 13 at node 32. High pass filter section 13 comprises operational amplifier 38, capacitors 33, 34 and 36, and resistors 35 and 37. The components are of selected values, and arranged in the known way such that the filter will not pass relatively lower frequencies. This can be accomplished as shown without any inductive elements in high pass filter stage 13.

The output 39 of operational amplifier 38 is the output of system 9. (see FIG. 2) The signal present at the output 14 (see FIG. 1) of system 9 has been filtered by passive low pass filter 12 and active high pass filter 13, whereby frequency components above the corner frequency of passive low pass section 12 and those below the corner frequency of active high pass section 13 are highly attenuated. The output signal is thereby comprised of a narrow frequency band that has not been attenuated by sections 12 and 13.

A filter according to the disclosed design is dimensioned, for example as small as 5 cm × 4 cm × 1.5 cm, or smaller. This is six times smaller than a passive filter alone and two times smaller than an active filter alone performing comparable filter functions.

Since low frequency signals are to be passed, not much inductance is required. This allows for the use of small inductive components and capacitors and hence a small circuit layout. Signal loss is kept to a minimum by the high impedance amplifier on the filter input stage. No noise is generated by this passive filter section.

The filter arrangement according to the invention can be advantageously employed in the field of digital communication where an analog to digital converter is a major element. Analog to digital converters need a so-called anti-aliasing filter. Active low-pass anti-aliasing filters have their own noise which masks any further attenuation. Such a circuit employing the filter according to the invention is practically noiseless.

A number of modifications are possible within the scope of the invention. For instance it is possible to provide plural passive low pass filters 12 and plural active high pass filter 13 for highly defined attenuation of the stop band. Furthermore, a circuit arrangement for each of the passive low pass filter section and high pass active filter section has been shown and described. The prior art also includes other specific filter section designs that might be substituted therefor as long as the active/passive attributes remain, as disclosed herein.

I claim:

1. An electrical filter for attenuating part of the frequency spectrum of an input signal, comprising:
   at least one active amplifier means; comprising resistors and an operational amplifier element operatively connected together; and providing a high impedance input and low impedance output;
   at least one passive filter means; comprising inductors, and capacitor elements operatively connected together to form at least one of a lowpass, highpass, bandpass and bandreject filter;
   at least one active filter means; comprising resistors, capacitors, and an operational amplifier element operatively connected together to form at least one of a lowpass, highpass, bandpass and bandreject filter;
   wherein said active amplifier means, said passive filter means, and said active filter means are respectively coupled in a series arrangement, the input of said active amplifier means is connected to a filter input, the output of said active amplifier means is connected to an input of said passive filter means, an output of said passive filter means is connected to an input of said active filter means, an output of said active filter means is connected to a filter output.

2. The filter recited in claim 1 comprises small dimensions, on the order of, 5 cm. × 4 cm. × 1.5 cm.

3. The filter recited in claim 1 wherein said at least one active amplifier means comprises at least one high impedance operational amplifier means, wherein said passive filter means comprises at least one low pass filter means, said at least one active filter mean comprises at least one high pass filter means which collectively forms an active-passive band pass filter network.

4. The filter recited in claim 3 wherein said filter has no internal electrical noise due to the respectively coupled series arrangement of said active amplifier means, said passive lowpass filter means, and said active filter means, wherein the passive filter means is noiseless, said active amplifier means providing impedance matching means and said active amplifier means compensates for impedance matching losses with a small amplification which are essentially noiseless, resulting in a noiseless active-passive lowpass filter.

5. The noiseless active-passive lowpass filter recited in claim 4 comprises an anti-aliasing filter.

* * * * *